United States Patent [19]

Ichimura et al.

[11] Patent Number: 5,620,522
[45] Date of Patent: Apr. 15, 1997

[54] MICROWAVE PLASMA GENERATOR

[75] Inventors: Satoshi Ichimura, Hitachi; Tadashi Sato, Mito; Takashi Iga; Kenichi Natsui, both of Hitachi, all of Japan

[73] Assignee: Hitachi, Ltd., Tokyo, Japan

[21] Appl. No.: 534,063

[22] Filed: Sep. 26, 1995

[30] Foreign Application Priority Data

Sep. 30, 1994 [JP] Japan .................... 6-237378

[51] Int. Cl.$^6$ .................................................. C23C 16/00
[52] U.S. Cl. .................. 118/723 MR; 118/719; 118/723 ME
[58] Field of Search ................ 156/345, 643.1; 216/67, 69, 70; 118/723 MP, 723 ME, 723 MW, 723 MR, 723 MA, 719; 204/298.38, 298.37, 298.16

[56] References Cited

U.S. PATENT DOCUMENTS

| | | | |
|---|---|---|---|
| 5,032,202 | 7/1991 | Tsai et al. | 156/345 |
| 5,133,825 | 7/1992 | Hakamata et al. | 156/345 |
| 5,203,960 | 4/1993 | Dandl | 156/643 |
| 5,266,146 | 11/1993 | Ohno et al. | 156/345 |
| 5,292,370 | 3/1994 | Tsai et al. | 118/723 MP |
| 5,389,154 | 2/1995 | Hiroshi et al. | 118/723 MR |

FOREIGN PATENT DOCUMENTS 63-38585  2/1988  Japan.

OTHER PUBLICATIONS

Journal of Vacuum Science Technology, vol. B9, No. 1, Jan./Feb. 1991, "Characterization of a Permanent Magnet Electron Cyclotron Resonance Plasma Source", Mantei et al, pp. 26–28.

Primary Examiner—Nam Nguyen
Assistant Examiner—Joni Y. Chang
Attorney, Agent, or Firm—Fay, Sharpe, Beall, Fagan, Minnich, & McKee

[57] ABSTRACT

A microwave plasma generator, wherein permanent magnets 3 forms intense magnetic field exceeding an intensity of electron cyclotron resonance magnetic field at microwave exit 6a of a dielectric body in an electron heating space chamber, the intensity of the magnetic field formed by the permanent magnet decreases rapidly to the zero at a point 14 in the vicinity of the boundary of the electronic heating space camber 1 and a plasma generating space chamber 2, and accordingly, most of electrons can be absorbed into electrons to heat and form high energy electrons at a position 12a–12c in electron cyclotron resonance layer 12.

34 Claims, 10 Drawing Sheets

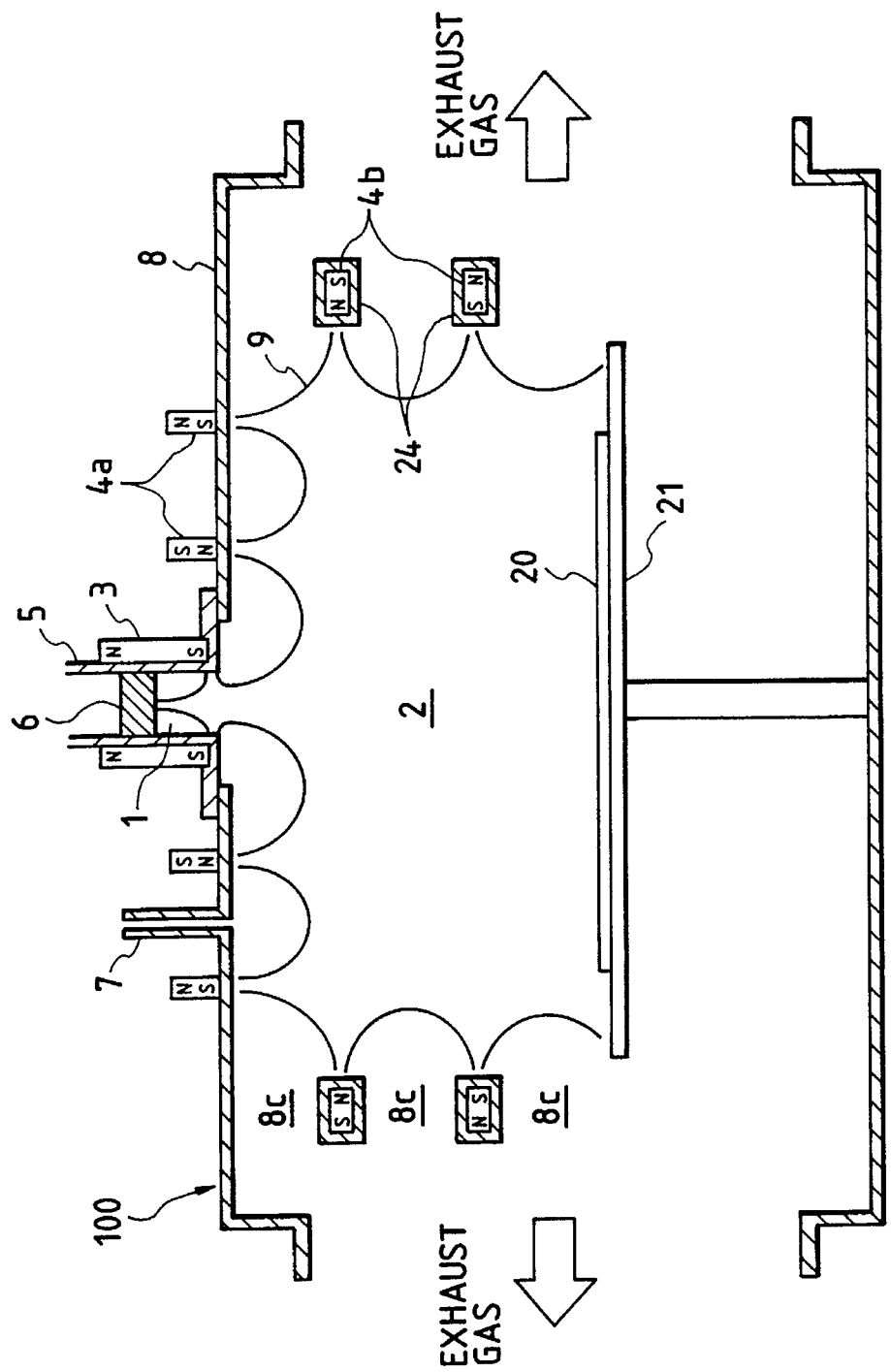

MICROWAVE PLASMA GENERATOR

BACKGROUND OF THE INVENTION

1. Field of the Invention

The present invention relates to a microwave plasma generator for generating plasma by transmitting microwave, and processing surface of an object to form desired shapes by irradiating ions in the plasma to the object, and especially, to a microwave plasma generator which is preferable for obtaining high magnetic field intensity distribution exceeding electron cyclotron resonance magnetic field by using permanent magnet.

2. Description of the Prior Art

The prior art in the field of the above described kind of microwave plasma generator was disclosed in, for example, J. Vacuum Science and Technology, B9 (1), Jan./Feb. p. 26–28 (1991). In the above publication, description that a same magnetic field can be formed a permanent magnet as the magnetic field formed by a solenoid coil which is described on pages 29–33 of the above reference and is used as a first static magnetic field generating means. In the above example, the permanent magnet used in replacement of the solenoid magnetic field became huge.

The huge size of the permanent magnet causes various problems described hereinafter.

Firstly, production cost of the permanent magnet becomes high. Further, an attenuation ratio of magnetic field at a location separated from the permanent magnet is small, and a large magnetic field remains in the processing object. Accordingly, a problem is caused that the plasma generator using the permanent magnet is not suitable for processing of magnetic field sensitive material such as, for example, fabrication of magnetic material. Furthermore, spacial fluctuation in propagation and absorption of microwave is significant on account of small attenuation in intensity of magnetic field and mild slope in spacial magnetic field gradient with the huge magnet. When the magnet is used in an ion source, the magnetic field remains at the vicinity of ion extracting electrodes, and as a result of bending orbits of the ions, a problem that the ion beam becomes divergent is generated. Furthermore, when an object is irradiated with ion beams, it is necessary to neutralize the irradiated portion with the same amount of electrons in order to avoid bearing electric charge of the irradiated portion, but a problem is caused that sufficient amount of electrons can not be supplied to the center of the ion beam when the electrons are supplied from outside the ion beam because the electrons can hardly traverse the magnetic field.

Generally speaking, in view of the quality of plasma, ion temperature in the above case is high because the ions accelerated by a slope of plasma potential is thermalized because the plasma generated in a strong magnetic field by a first static magnetic field generating means are diverged in a magnetic field free region surrounded with surface magnetic field generated by a second static magnetic field generating means in order to make the plasma uniform in a large size area, and the majority of the generated ions traverse the magnetic field. Separation of ion species is caused depending on difference of cyclotron diameter in the magnetic field, additionally, when used in a plasma processing apparatus, a problem such that the plasma processing is not performed uniformly is caused because radicals generated simultaneously with the plasma are not homogenized by the electromagnetic field.

SUMMARY OF THE INVENTION

1. Objects of the Invention

In view of the above described problems of the prior art, one of the objects of the present invention is to provide a microwave plasma generator which is inexpensive with a small-sized permanent magnet and usable certainly in the aim of fabricating magnetic films, and can generate stable plasma which is uniform in a wide range.

2. Methods of Solving the Problems

The microwave plasma generator relating to the present invention comprising a wave guide tube for introducing microwave, an electron heating space chamber formed at a location in down stream side from a dielectric body in the wave guide tube, a plasma generating space chamber connected to the electron heating space chamber, a first static magnetic field generating means, and a second static magnetic field generating means, wherein the first magnetic field generating means comprising permanent magnets surrounding outer periphery of the electron heating space chamber forms a strong magnetic field, which exceeds an intensity of electronic cyclotron resonance magnetic field in a microwave exit portion of the dielectric body, along the microwave transmitting direction in the electron heating space chamber, and concurrently forms a cusped magnetic field, which generates a magnetic field with steep gradient in intensity at a portion between the microwave exit of the dielectric body and the boundary of the electron heating space chamber with the plasma generating space chamber and inverses its direction opposite to the strong magnetic field in the plasma generating space chamber from the boundary of the electron heating space chamber with the plasma generating space chamber, and the second static magnetic field generating means comprises permanent magnets which are arranged around the plasma generating space chamber alternately reverse in its polarity.

In accordance with the present invention, only microwave in a dominant mode is transmitted by a wave guide tube when the microwave is supplied into the wave guide tube. At that time, the microwave having a strong electric field can be introduced stably into an electron heating space chamber because the electron heating space chamber is formed at downstream side of the dielectric body in the wave guide tube and the electron heating space chamber has a small cross sectional area by being installed in the wave guide tube. If the electron heating space chamber has a small cross sectional area as above mentioned, small size permanent magnets can be used as for the first static magnetic field generating means which are arranged at outer periphery of the electron heating space chamber, and accordingly, large size permanent magnets as the prior art become unnecessary.

Because the permanent magnet as for the first static magnetic field generating means as above mentioned forms a magnetic field of which magnetic gradient varies steeper than a length of the wave length of the microwave in the electron heating space chamber, in other words, a specific intensity of the magnetic field which varies depending on plasma condition, for instance, spacial variation in microwave absorbing position which is brought by fluctuation of the intensity of magnetic field, wherein the microwave is readily absorbed, is shorter than the wave length of the microwave, unstable elements relating to propagation and absorption of the microwave can be eliminated as much as possible, and the microwave having high electric field can be obtained certainly and stably. Furthermore, most of the microwave can be absorbed into electrons to heat the electrons to be high energy electrons in the electron heating space chamber.

At that time, the permanent magnet as for the first static magnetic field generating means forms cusped magnetic field, wherein the direction of the magnetic field inverses at downstream side of the boundary of the electron heating space chamber with the plasma generating space chamber as above mentioned, and accordingly, electrons locating near an axial center of the electron heating space chamber are facilitated to diffuse toward the plasma generating space chamber. Additionally, the high energy electrons introduced and diffused into the plasma generating space chamber can generate plasma uniform in a wide range by colliding with neutral particles and electrolytically dissociating the particles in the plasma generating space chamber because the electrons are not effected with influence of magnetic field of the permanent magnet as much as separated from the permanent magnet in the plasma generating space chamber. Further, as a plurality of permanent magnets are arranged at outer periphery of the plasma generating space chamber so as to have alternately opposite polarity with adjacent permanent magnet mutually as for the second static magnetic field generating means, not only the diffused high energy electrons, but also the plasma generated by the high energy electrons can be enclosed effectively into the plasma generating space chamber, and accordingly, plasma having high density can be formed in the plasma generating space chamber.

BRIEF DESCRIPTION OF THE DRAWINGS

FIG. 14 is a schematic cross sectional view of the microwave plasma generator indicating the other embodiment of the present invention.

DESCRIPTION OF PREFERRED EMBODIMENTS

Preferred embodiments of the present invention are described in detail hereinafter referring to FIGS. 1-14.

Embodiment 1

FIGS. 1–4 indicate the first embodiment of the present invention.

Figure 4:
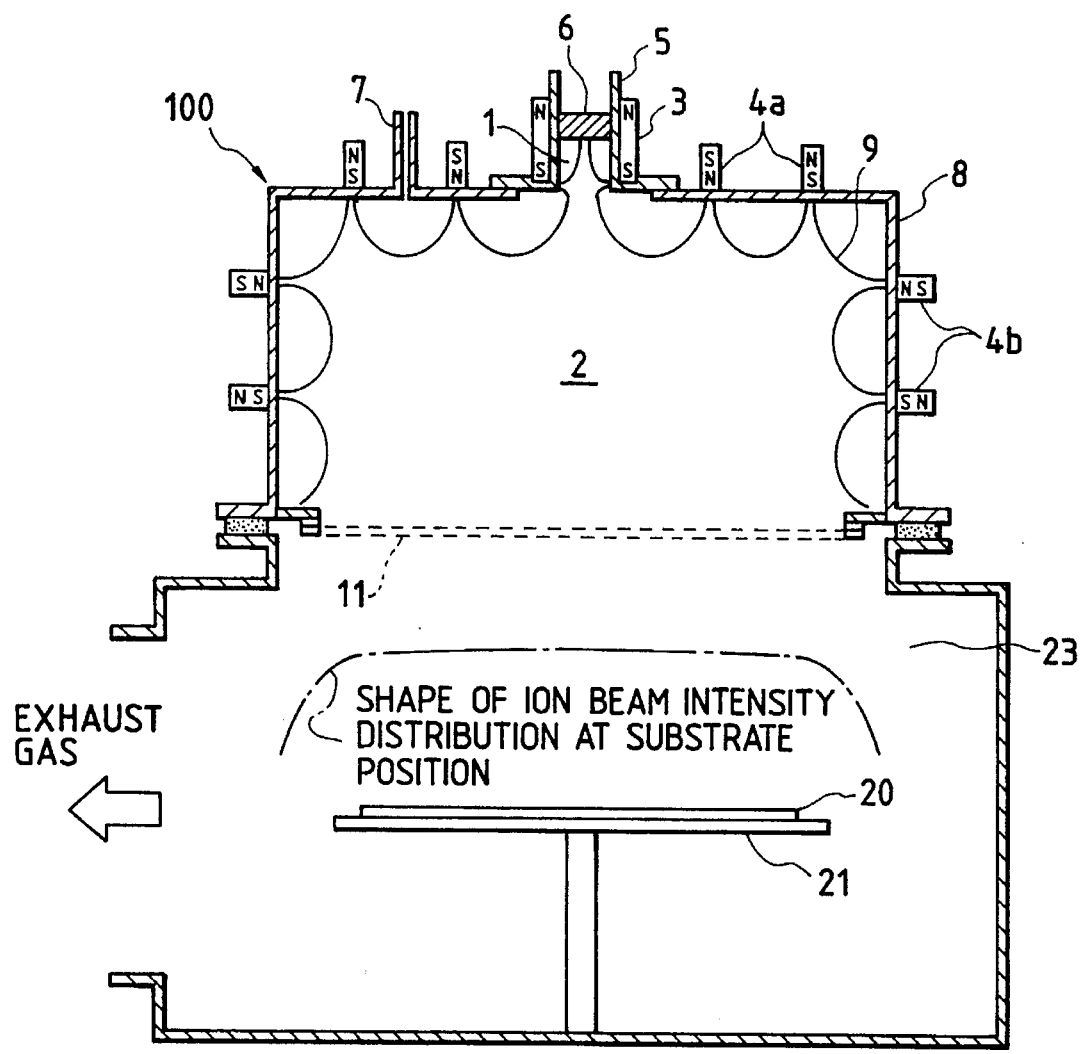
FIG. 4 is a schematic cross sectional view indicating a whole structure of the microwave plasma generator, FIG. 5 (a) is an enlarged view of the important portion of the microwave plasma generator in the second embodiment of the present invention, FIG. 5 (b) is a graph indicating a distribution of the intensity of magnetic field at a position along the axis of the electron heating space chamber and the plasma generating space chamber.

Referring to FIG. 4, the microwave plasma generator in the present embodiment comprises a wave guide tube 5, a discharge chamber 100 which is connected to the wave guide tube 5 at the downstream side of the tube 5, and a treating chamber 23 which is connected to the discharge chamber 100 at the downstream side of the chamber 100.

After pumping out exhaust gas from inside of both the discharge chamber 100 and the treating chamber 23 using an exhaust gas pumping system (not shown in FIG. 4), a specified gas such as argon gas is introduced into the discharge chamber 100 by a gas introducing means 7 for filling atmosphere in the discharge chamber with the specified gas. Then, microwave is introduced into the specified gas atmosphere through the wave guide tube 5 for generating plasma by microwave discharging in the discharge chamber 100, ions are extracted from the generated plasma as a beam by beam extracting electrodes 11 which are installed at the boundary portion between the discharge chamber 100 and the treating chamber 23, and the extracted ions are irradiated onto a substrate 20 for forming a desired shape with the surface of the substrate. The wave guide tube 5 is composed of non-magnetic material such as stainless steel in a shape of which cross section has a flatten rectangular shape (for example, short side 27 mm×long side 96 mm), a dielectric body 6 is installed hermetically at an intermediate position in the discharge chamber 100, and transmit only the microwave having the dominant mode ($TE_{10}$ mode) to the downstream side of the body 6 when microwave having generally used frequency 2.45 GHz is introduced into the wave guide tube 5 from the upstream side (not shown in FIG. 4). The dielectric body 6 is generally composed of ceramics such as quartz and alumina.

Figure 1:
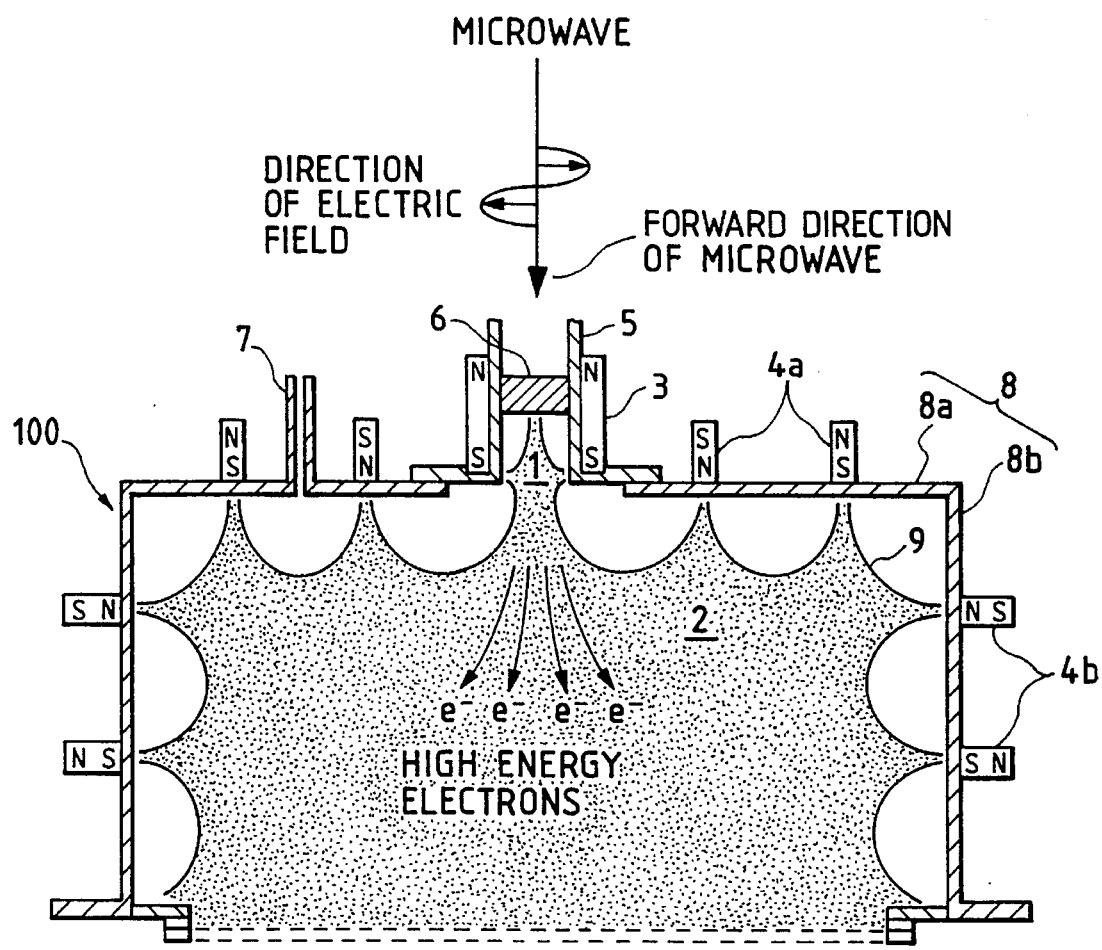
FIG. 1 is a schematic cross sectional view of the microwave plasma generator indicating the first embodiment of the present invention.
Figure 2A:
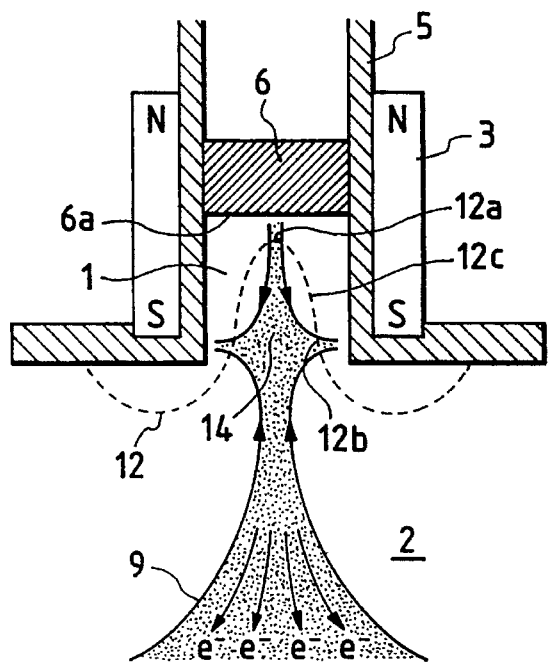
FIG. 2(a) is an enlarged view of the important portion of the microwave plasma generator of the present invention, FIG. 2 (b) is a graph indicating a relationship between the electronic current density versus position in the plasma generating space chamber, FIG. 2 (c) is a graph indicating a distribution of the intensity of magnetic field at a position along the axis of the electron heating space chamber and the plasma generating space chamber.
Figure 2B:
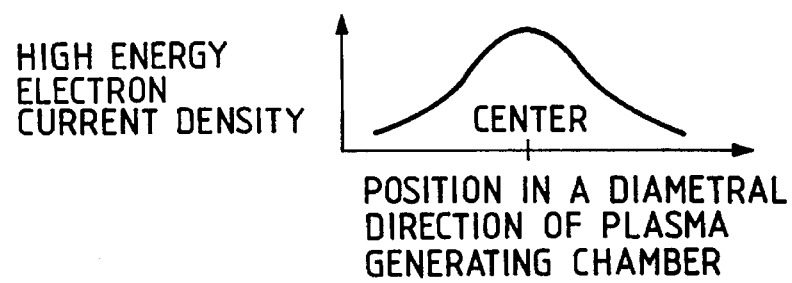
Figure 2C:
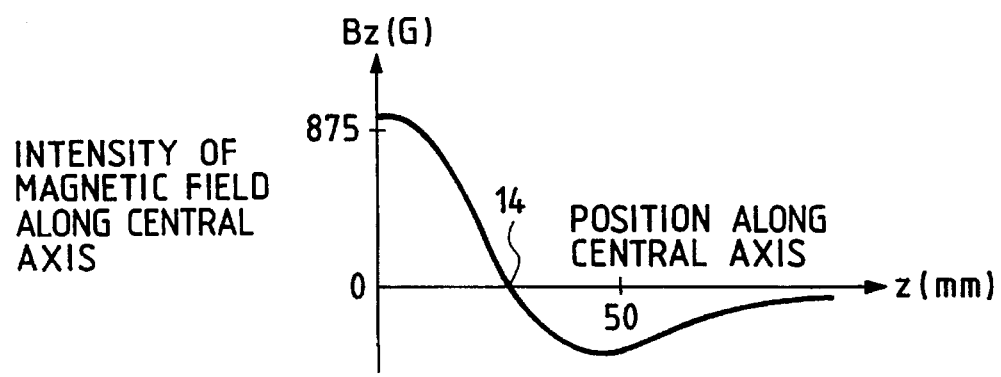

In accordance with the present embodiment, a part of the wave guide tube 5 having a flatten rectangular cross section as above mentioned is utilized as the discharge chamber 100, and the discharge chamber 100 comprises an electron heating space chamber 1 and a plasma generating space chamber 2. The electron heating space chamber 1 is a space portion having a small cross section formed at a position in the downstream side of the dielectric body 6 in the wave guide tube 5 as shown in FIGS. 1 and 2, and is formed in a shape of 30 mm long in the wave guide tube 5 having a rectangular cross section. When microwave is introduced into the wave guide tube 5, the microwave passing through the electron heating space chamber 1 is changed to strong electric field by the space portion having a small cross section formed in the wave guide tube 5. The rectangular shape of the cross section of the electron heating space chamber 1 has preferably a ratio of short side/long side range of ½–⅕.

Figure 3:
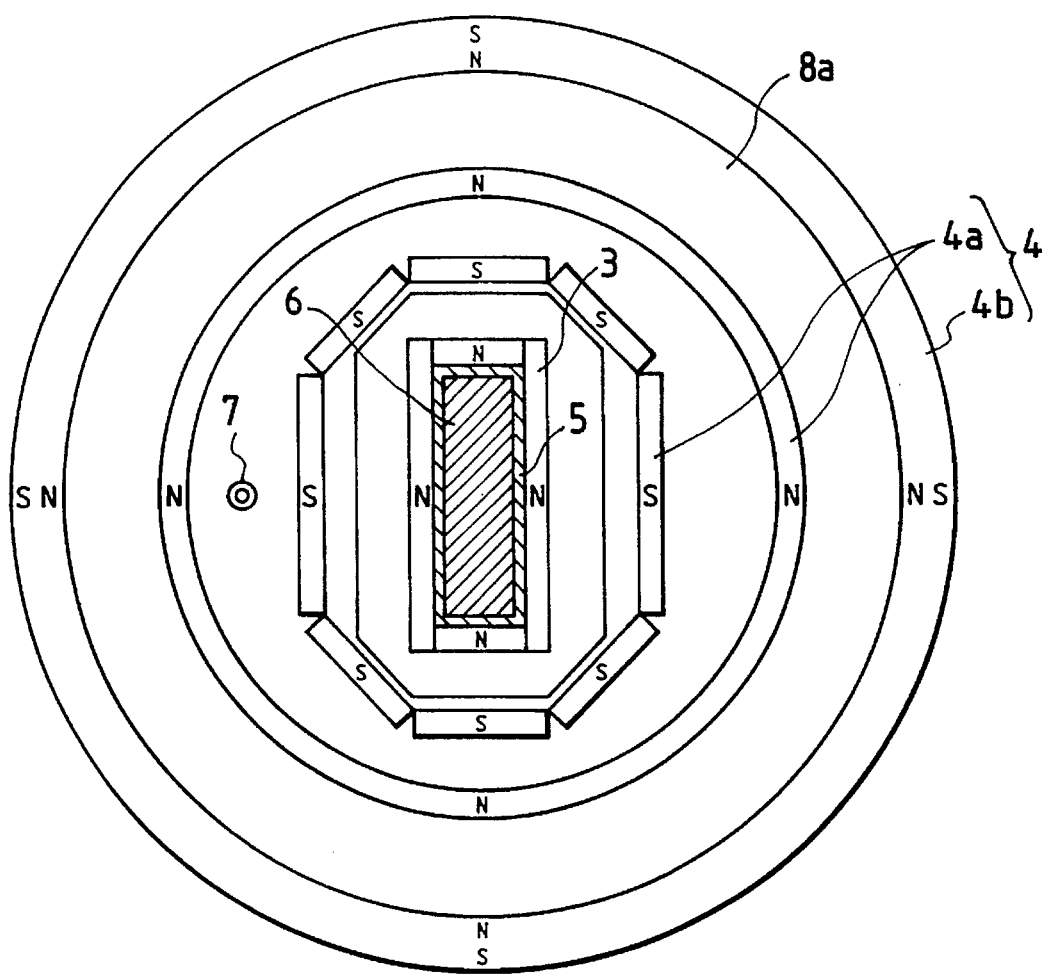
FIG. 3 is a plan view of the microwave plasma generator.

The plasma generating space chamber 2, which is composed of non-magnetic material such as stainless steel and formed in a hollow body having a circular top wall 8a and a peripheral wall 8b, has a remarkably larger space (400 mm in inner diameter and 200 mm high) than the electron heating space chamber, and its central axis coincides with the central axes of the electron heating space chamber 1 and the wave guide tube 5. Permanent magnets 3 as for the first static magnetic field generating means are arranged at outer periphery of the electron heating space chamber 1. The plural permanent magnets 3, which are composed of materials including samarium, cobalt and others having a high residual magnetic flux density (about 11,000 G), are arranged to surround the outer periphery of the wave guide tube 5 as shown in FIG. 3, along a length in the axial direction of the wave guide tube 5 from a location of the dielectric body 6 to the end of the downstream side as shown in FIG. 2, in order to form a magnetic field along the transmitting direction of the microwave as shown by the dotted area in FIGS. 1 and 2. In the above case, an intensity of the magnetic field in the electron heating space chamber 1 becomes larger (in the present embodiment, about 950 G) than the intensity of the electron cyclotron resonance magnetic field (875 G) at the exit for the microwave 6a of the dielectric body 6 as shown in FIGS. 2 (*a*) and 2 (*c*), the intensity decreases rapidly in the direction toward downstream side and becomes zero at the vicinity of the boundary between the downstream end of the electron heating space chamber 1 and the plasma generating space chamber 2, and the direction of the magnetic field is inverted at downstream side from the above boundary, in other words, the magnetic field is composed so as to form so-called cusped magnetic field.

The distance from the exit for the microwave 6a of the dielectric body 6 to the point 14 near the boundary of the electron heating space chamber and the plasma generating space chamber where the intensity of the magnetic field becomes zero is preferably shorter than the wave length of the microwave supplied to the wave guide tube 5. The permanent magnet 3 which forms the above mentioned magnetic field has such dimensions in the present embodiment as 6 mm thick, 50 mm long in the magnetized direction, and 300 mm long in circumference.

A plurality of permanent magnets 4 as for the second static magnetic field generating means are arranged at outer periphery of the plasma generating space chamber 2. The plural permanent magnets 4, which are composed of the same materials as of the permanent magnet 3 as for the first static magnetic field generating means, comprises first permanent magnet groups 4a which are arranged at the top wall 8a of the plasma generating space chamber 2 with a designated interval as shown in FIG. 3 and at outer peripheral wall of the plasma generating space chamber 2, respectively, and second permanent magnet groups 4b which are arranged at outer peripheral wall 8b of the plasma generating space chamber 2 with a designated interval along the peripheral wall 4b as shown in FIG. 4, respectively. Further, respective of the above mentioned permanent magnets 4 is mutually arranged alternately in opposite direction in polarity. That means, as shown in FIGS. 1 and 3, the first magnet of the first permanent magnet group 4a is arranged at the top wall 8a in a manner that S-pole is upward and N-pole is downward so as to have opposite polarity against the polarity of the permanent magnet 3, the second magnet of the first permanent magnet group 4a is arranged in a manner that N-pole is upward and S-pole is downward so as to have opposite polarity against the polarity of the first magnet of the first permanent magnet group 4a, and at the outer peripheral wall 8b, the second permanent magnet groups 4b are arranged changing the polarity alternately in the same manner as the first permanent magnet groups 4a. Accordingly, a large space area is made a magnetic field free region by forming a multipolar magnetic field in the plasma generating space chamber 2. For example in the present embodiment, intensity of the magnetic field at center of the plasma generating space chamber 2 is about 20 G, and at the position of the beam extracting electrode 11 is less than 10 G.

Referring to FIG. 1, the numeral 9 expresses lines of magnetic force formed by the plural permanent magnets 4.

Operation of the plasma generator in the present embodiment having the above structure is explained hereinafter.

When the discharge chamber 100 comprising the electron heating space chamber 1 and the plasma generating space chamber 2 has an atmosphere filled with a specified gas and microwave having frequency of 2.45 GHz is supplied to the wave guide tube 5, the wave guide tube 5 of which cross section is a flatten rectangular shape as above mentioned transmits only microwave in dominant mode. The direction of electric field at the above microwave transmitting mode coincides with the large side direction of the cross section of the wave guide tube 5.

When transmitting the above microwave, the microwave with strong electric field can be introduced stably in an electron heating space chamber 1 by forming the electron heating space chamber 1 having a small cross sectional area at downstream side of the dielectric body 6 in the wave guide tube 5. If the electron heating space chamber I has a small cross sectional area, the permanent magnets 3 as for the first static magnetic field generating means arranged at outer periphery of the chamber 1 can be a small size, and accordingly, the large size permanent magnet used in the prior art becomes unnecessary.

In accordance with the present embodiment using a rectangular wave guide tube 5 of which cross sectional sides were 27 mm long×96 mm long and the electron heating space chamber about 30 mm long, about 80 V/cm of the microwave electric field intensity averaged in a cross section of the wave guide tube could be realized by 400 W of applied microwave power.

The permanent magnet 3 forms a larger magnetic field than the electron cyclotron resonance magnetic field at the exit for the microwave 6a of the dielectric body 6, and the intensity decreases rapidly in the direction toward downstream side and becomes zero at the point 14 near the boundary between the electron heating space chamber 1 and the plasma generating space chamber 2. Therefore, thickness of the electron cyclotron resonance layer 12 is thin, and although electron heating ability per the intensity of the microwave electric field becomes small, the intensity of the electric field itself is sufficiently strong for heating the electrons by making the electron absorb most of the microwave at the position 12a–12c in the electron cyclotron resonance layer 12 to obtain high energy electrons.

In this specification, the high energy electron means an electron having an ability to ionize gas and energy more than about 10 eV, and differs naturally from an electron which can not ionize the gas.

Referring to FIG. 2 (*c*), the distribution curve of the intensity of the magnetic field generated by the permanent magnet 3 decreases rapidly in the range from the microwave exit 6a of the dielectric body 6 in the electron heating space chamber 1 to the point 14 near the boundary between the electron heating space chamber 1 and the plasma generating space chamber 2, and length of the above range is made shorter than the wave length of the microwave. Therefore, unstable elements relating to propagation and absorption of the microwave can be eliminated as much as possible, and the microwave having high electric field can be obtained certainly and stably.

Generally, electron moves approximately along magnetic line of force in strong magnetic field, but electron can readily traverse the magnetic line of force in weak magnetic field. Accordingly, electron existing at the exit end of the electron heating space chamber 1, in other words, electron existing at the point 14 near the boundary between the electron heating space chamber 1 and the plasma generating space chamber 2 can move back and forth in the cusped magnetic field. In the above case, electron is heated and made to have high energy when the electron passes through the portions at a position 12a or 12b in the electron cyclotron resonance layer 12, and the high energy electron diffuses along a region of the above cusped magnetic field and ionizes neutral particles to generate plasma by colliding with neutral particles during moving back and forth in the region. Further, low energy electron which is generated at the above ionization process enters into the electron heating space chamber i during moving back and forth in the region of the multipole cusped magnetic field, and the low energy electron is heated and made to have high energy when the electron passes through the portions at a position 12a or 12b in the electron cyclotron resonance layer 12 to be the high energy electron which can ionize neutral particles to generate plasma.

In the above case, as the permanent magnet 3 forms cusped magnetic field, wherein the direction of the magnetic field is inverse, in the downstream region from the point 14 near the boundary of the electron heating space chamber 1 and the plasma generating space chamber 2 where intensity of the magnetic field is zero as shown in FIGS. 2 (a) and 2 (c), the current density of the high energy electrons moving from the electron heating space chamber 1 to the plasma generating space chamber 2 has a peak distribution at the central axis of the electron heating space chamber I as shown in FIG. 2 (b). Therefore, plasma generation in a region far from the electron heating space chamber 1, that means, in the magnetic field free region in the plasma generating space chamber 2, can be enhanced. In accordance with experiments, when a metal plate of 350 mm in diameter was placed at the position of the beam extracting electrode under a condition of argon gas pressure in the discharge chamber 100 of $1.0 \times 10^{-4}$ Torr and supplied microwave power of 400 W, the ion current captured by the metal plate reached 3 A. From the experimental result, it was confirmed that the obtained value, 3 A, was 20 times of the amount of generated ions (0.15 A) in the electron heating space chamber 1 when it was postulated that all of the neutral gas flowing into the electron heating space chamber 1 under the above gas atmosphere were ionized in monovalent.

Generally, mean free path of the electron necessary for ionizing neutral particle extends from a few meters to tens meters under a high vacuum condition ($1 \times 10^{-5}$ – $1 \times 10^{-3}$ Torr), and the high energy electron moves randomly in the magnetic field free region with being reflected many times by the multipole cusped magnetic field in the plasma generating space chamber 2 before ionizing the neutral particle. Therefore, plasma is generated uniformly in the magnetic field free region. Further, as plural permanent magnets as for the second static magnetic field generating means are arranged surrounding outer periphery of the plasma generating space chamber 2 to form a multipole cusped magnetic field by being arranged in a manner that adjacent magnet, is arranged alternately with inverted magnetic polarity respectively, not only the diffused high energy electrons, but also the plasma generated by the high energy electrons can be enclosed into the plasma generating space chamber 2 effectively, and consequently, the plasma having a high density can be formed certainly. The plasma generated in the magnetic field free region is hardly effected by the magnetic field, and accordingly, preferable plasma having uniform ion species distribution and low ion temperature can be obtained.

The amount of the high energy electron and plasma in the plasma generating space chamber 2 are enclosed more effectively by stronger magnetic field in the vicinity of the magnets. Therefore, sometimes a magnetic field stronger than the intensity of the electron cyclotron resonance magnetic field is set in the vicinity of the permanent magnet 4.

However, in the present embodiment, the discharge chamber 100 is formed of the electron heating space chamber i which is formed at downstream side from the dielectric body 6 in the wave guide tube 5 and the plasma generating space chamber 2 which is formed at downstream side from the electron heating space chamber 1 as mentioned above, a strong magnetic field is formed at upstream side of the electron heating space chamber 1 by the permanent magnets 3 which are arranged at outer periphery of the electron heating space chamber 1, and a cusped magnetic field is formed by decreasing the intensity of the magnetic field rapidly toward downstream direction. Therefore, electronic heating in the electron cyclotron resonance layer 12 formed in the vicinity of the permanent magnet 4 in the plasma generating space chamber 2 is hardly caused because most of the microwave supplied into the wave guide tube 5 is absorbed in the electron heating space chamber 1 and, even if the microwave leaks into the plasma generating space chamber 2, the cross sectional area of the plasma generating space chamber 2 is remarkably large and the intensity of the electric field becomes very weak.

When ion is extracted from the plasma generated as mentioned above by the beam extracting electrodes 11 as shown in FIG. 4, and the ion is irradiated to the substrate 20 in the treating chamber 23, the problems at extracting the beams such as dielectric break down and dispersion of beams caused by a magnetic field can be preferably prevented in comparison with the prior art because the effect of the magnetic field is scarce at the position of the beam extracting electrodes. Because the temperature of the ions in plasma which is generated in the region having scarcely magnetic field is low and a broad ion beam having high directivity can be obtained, shape of the ion beam intensity distribution becomes the one as shown in FIG. 4, in other words, the distribution becomes uniform in a wide range. For instance, fluctuation of the ion beam current with the substrate 20 of 300 mm in diameter could be restricted within ±5%, and accordingly, a processing having extremely high quality can be performed.

Further, because the effect of magnetic field at the position of the beam extracting electrodes 11 is very scarce, neutralization of the beam becomes possible by supplying electrons from outer periphery of the ion beam.

Embodiment 2

Figure 5A:
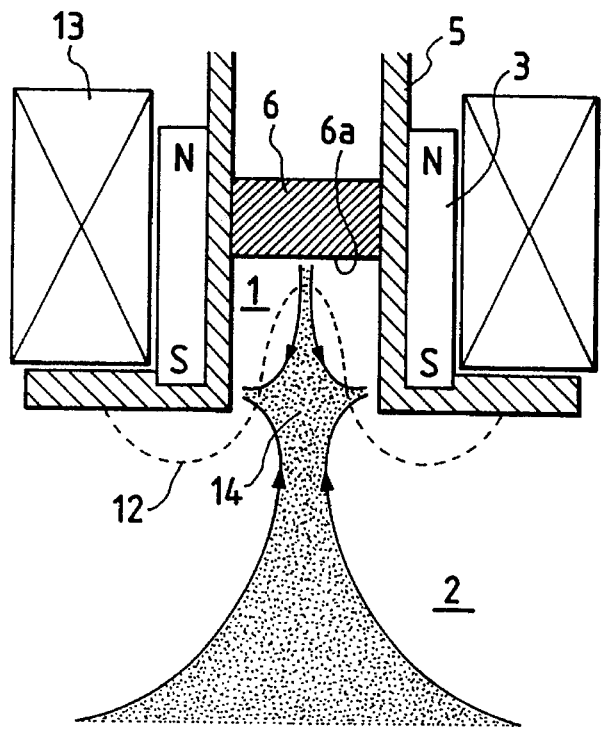
Figure 5B:
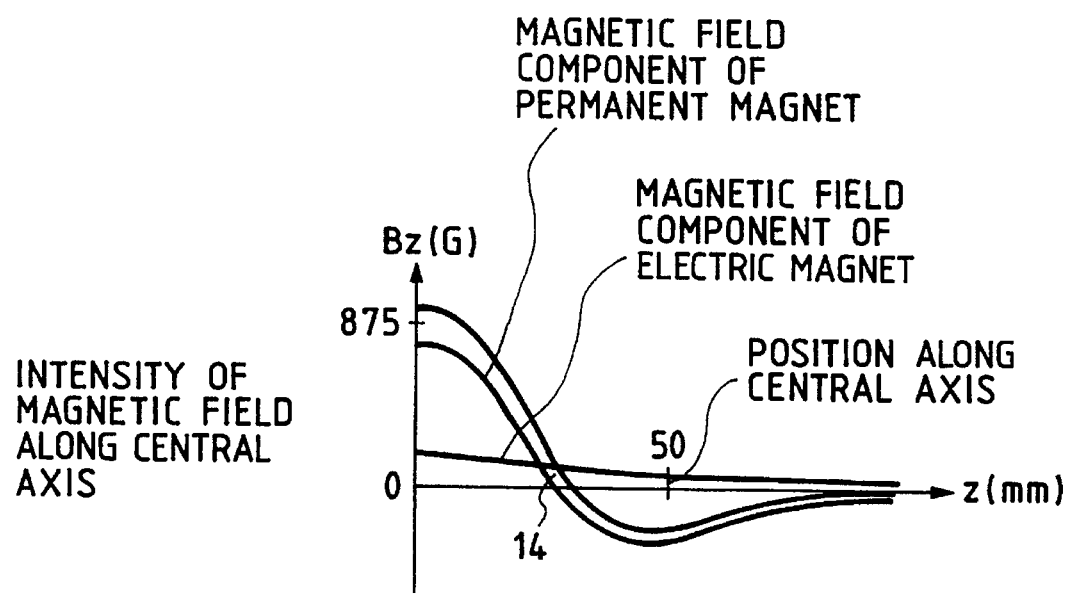

FIGS. 5 (a), 5 (b), and 5 (c) indicate second embodiment of the present invention.

In the present embodiment, the first magnetic field generating means is composed of both the permanent magnet and electric magnet 13 which are arranged at outer periphery of the permanent magnets 3. That means, the permanent magnets 3 in the present embodiment have the same shade as that in the first embodiment mentioned previously, and are composed so that the intensity of the magnetic field in the axial direction of the electron heating space chamber 1 decreases approximately 15% as a whole in comparison with the first embodiment as shown in FIG. 5 (*b*), and the intensity of the magnetic field by single permanent magnet 3 is set to be somewhat weaker than the intensity of the electron cyclotron resonance magnetic field at the microwave exit 6a of the dielectric body 6.

On the other hand, the electric magnet 13 have the magnetic field component as shown in FIG. 5 (*b*), and are composed so that the intensity of the above magnetic field component exceeds the intensity of the electron cyclotron resonance magnetic field at the microwave exit 6a of the dielectric body 6 as shown by a bold line in FIG. 5 (*b*) by overlapping the magnetic field component by the electric magnets 13 to the magnetic field component by the permanent magnets 3. Accordingly, a strong magnetic field exceeding the intensity of the electron cyclotron resonance magnetic field is formed at the microwave exit 6a of the dielectric body 6 in the electron heating space chamber 1 by both the permanent magnets 3 and the electric magnets 13, the intensity of the magnetic field decreases rapidly at the downstream side from the microwave exit 6a to be zero at the point 14 near the boundary between the electron heating space chamber 1 and the plasma generating space chamber 2, and the cusped magnetic field having inverted direction of polarity to the strong magnetic field is formed at further downstream side. As the other portion than the first static magnetic field generating means have the same structure as the first embodiment, explanation on the other portion is omitted in the present embodiment.

As described above, the magnetic field formed by both the permanent magnets 3 and the electric magnets 13 becomes same strong magnetic field at the microwave exit 6a of the dielectric body 6 in comparison with the first embodiment wherein the first static magnetic field generating means as composed of only permanent magnets 3, but the magnetic field in the plasma generating space chamber 2 (cusped magnetic field) can be weaker than that in the first embodiment. Because, the residual magnetic flux density of the permanent magnet itself is somewhat weaker than that in the first embodiment, the magnetic field becomes smaller as separating far from the permanent magnets 3, and the magnetic field can be decreased certainly by arranging electric magnet 13 at outer periphery position of the permanent magnets 3 for cancelling magnetic fields by the electric magnets 13 and the permanent magnets 3 mutually in the plasma generating space chamber 2. Accordingly, a fraction of the magnetic field free region in the plasma generating space chamber 2 can be increased further, and consequently, the plasma can be generated more uniformly.

In the present embodiment, the electric magnet 13 is made of copper wire winding having a cross sectional dimensions of 60×20 mm, and is composed so as to generate the magnetic field of approximately 150 G at the microwave exit 6a of the dielectric body 5 by flowing current of approximately 2 A/mm$^2$ per unit cross sectional area. The size of the electric magnet 13 is relatively small, and the magnetic field is readily formed.

Embodiment 3

Figure 6:
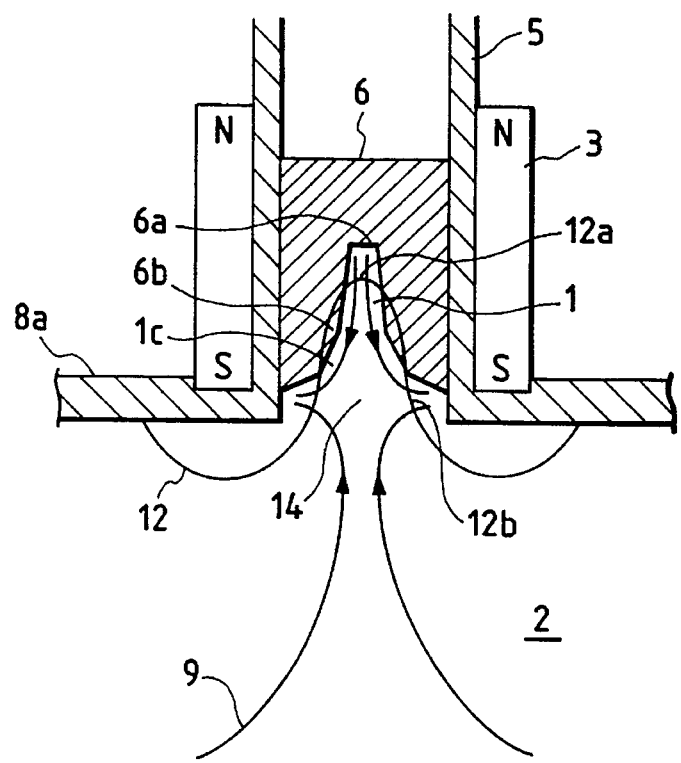
FIG. 6 is an enlarged view of the important portion of the microwave plasma generator in the third embodiment of the present invention.

FIG. 6 indicates the third embodiment of the present invention.

In the present embodiment, the shape of the dielectric body 6 in the wave guide tube 5 has been improved. That is, a projection 6b which is projected along emitting direction of the microwave and toward the electron heating space chamber 1 is formed at a portion of the microwave exit 6a of the dielectric body 6. The projection 6b is arranged at a portion 1c where the projection prevents the electron, which do not move toward the plasma generating space chamber 2, from being heated and made to have high energy in the electron heating space chamber 1 as explained in the first embodiment. Accordingly, in other words, the projection 6b blocks a fraction of electron heating space chamber, wherein electron do not diffuse toward the plasma generating space chamber 2, nor contribute to generation of the plasma.

As described previously, electrons at the position 12a and 12b of the electron cyclotron resonance layer 12 can be heated effectively by providing the projection 6b as a part of the dielectric body 6. Actually, when a metal plate of 350 mm in diameter was placed at the position of the beam extracting electrode under a condition of argon gas pressure in the discharge chamber 100 of $1.0\times10^{-4}$ Torr and supplied microwave power of 400 W, the ion current captured by the metal plate was confirmed to be 4.5 A. This value is 1.5 times in comparison with the first embodiment wherein the ion current of 3 A was obtained. Accordingly, it reveals that the electron having higher energy than the first embodiment is obtained.

The projection 6b blocks almost all portion of 1c which prevents the electron from going toward the plasma generating space chamber 2, but if a small portion of the portion 1c which prevents the electron from going toward the plasma generating space chamber 2 is remained unblocked as shown in FIG. 6, existence of the small portion 1c facilitates ignition of plasma and stabilizes the plasma discharge, and more stable high energy electrons can be obtained. In the above case, a fraction of absorbed microwave by the above region 1c is assumed to be approximately 10–20% of total microwave power.

Embodiment 4

Figure 7:
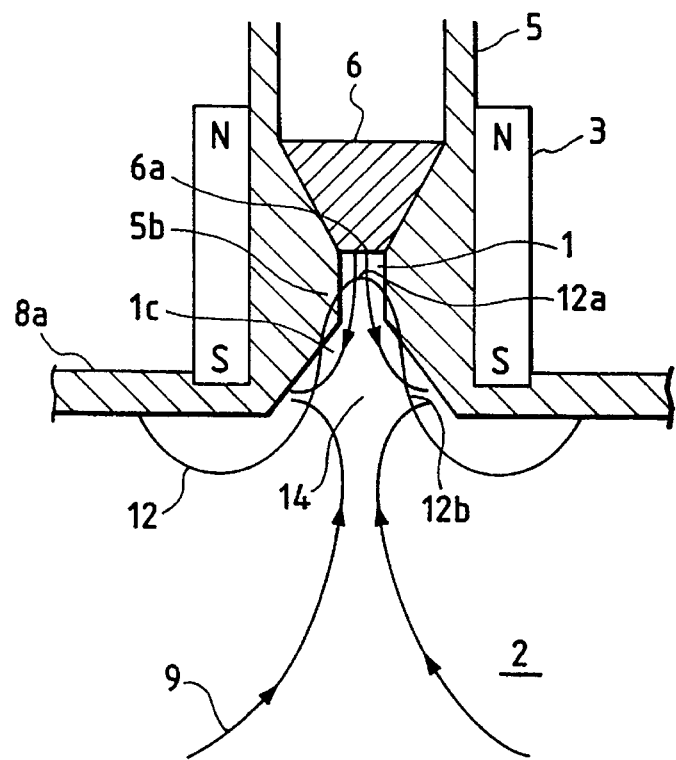
FIG. 7 is an enlarged view of the important portion of the microwave plasma generator in the fourth embodiment of the present invention.

FIG. 7 indicates the fourth embodiment of the present invention.

In accordance with the present embodiment, a projection 5b is formed by expanding a part of inner wall of the wave guide tube 5 at a portion 1c where is equivalent to a position in the electron heating space chamber 1 of the third embodiment, where the projection prevents the electron from being heated and made to have high energy. That is, the projection 5b has a shape corresponding to the shape of the dielectric body 6 which is formed in an inverse trapezoid shape and expands gradually along the downstream side. Further, the projection 5b extends somewhat outside in the axial direction as keeping the size at the exit end, and the cross sectional area of open space in the electron heating space chamber 1 is extended widely at downstream side of the extended projection. Even if the projection 5b is formed by a part of the wave guide tube 5 as explained above, plasma generating efficiency per unit microwave power can be certainly increased. When a metal plate of 350 mm in diameter was placed at the position of the beam extracting electrode 11, it was confirmed that the ion current of 5 A was obtained.

However, the third embodiment was preferable to the fourth embodiment in regard to stabilization of the discharge. When surface of the substrate 20 in the treating chamber 23 was made of electric conductive material and the surface was etched with the ion beam, electric conductive particles were released from the surface and adhered to the microwave exit 6a of the dielectric body 6. Therefore, in some cases, introducing the microwave becomes difficult. In regard to an efficiency in preventing the released particles from adhering to the microwave exit 6a, the shape of the electron heating space chamber 2 having the projection 5b as shown in FIG. 7 of the fourth embodiment was more effective than the shape in the third embodiment. The discharge stability and preventing effect for adhering the released particles differ mutually depending on the difference in shape of the projections 6b and 5b, and the shape may be selected in view of its usage.

Embodiment 5

Figure 8:
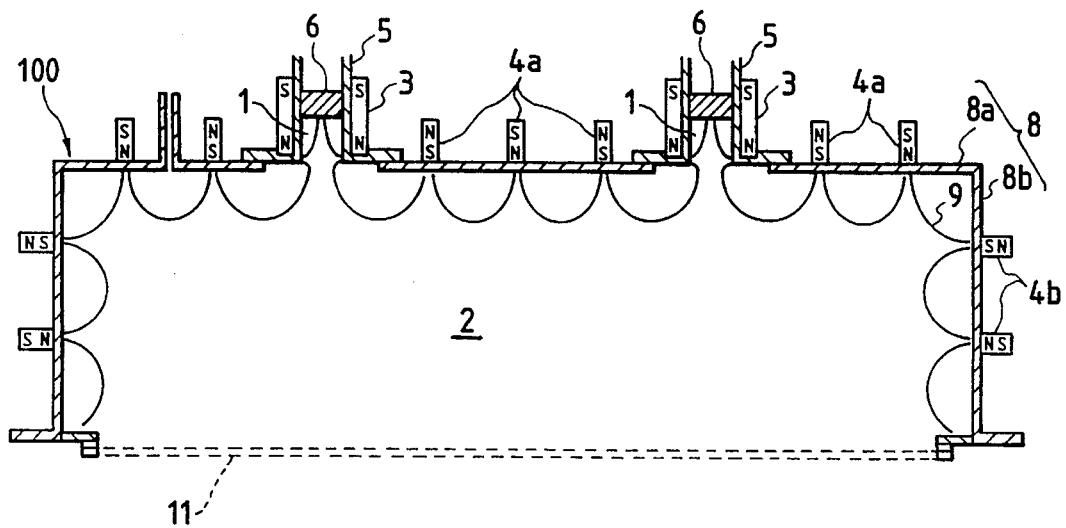
FIG. 8 is a schematic cross sectional view of the microwave plasma generator in the fifth embodiment of the present invention.
Figure 9:
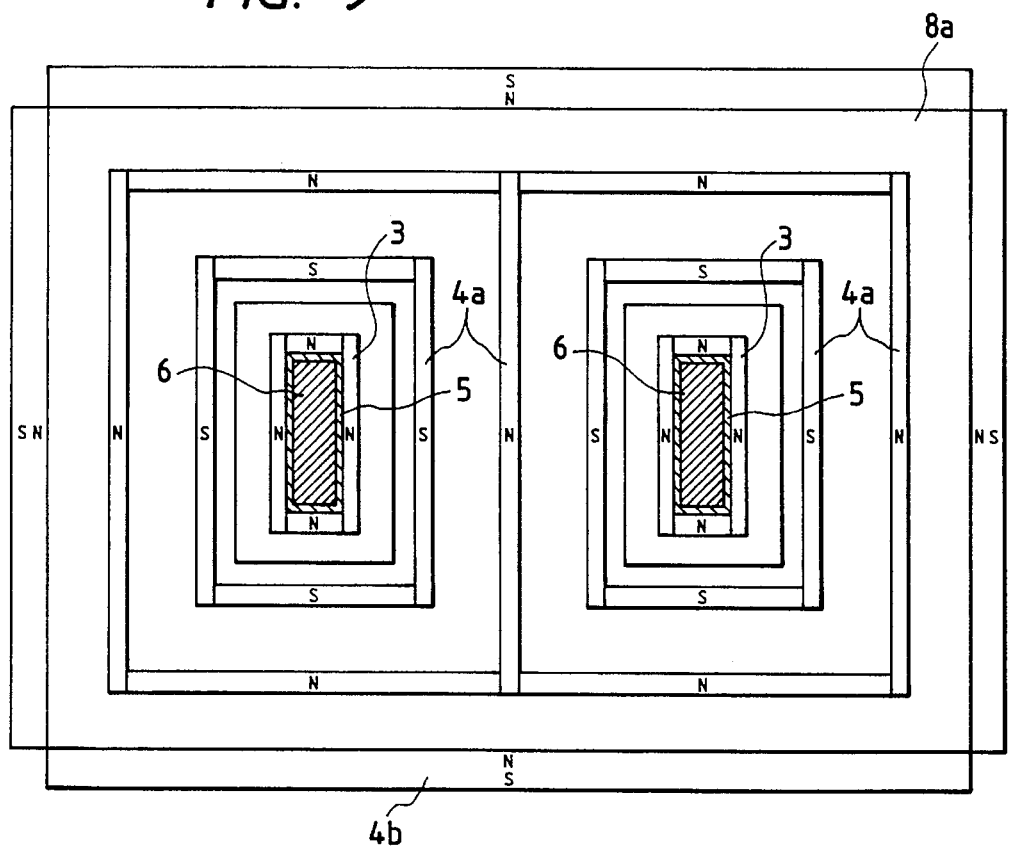
FIG. 9 is a plan view of the microwave plasma generator shown in FIG. 8.

FIGS. 8 and 9 indicate the fifth embodiment of the present invention.

In accordance with the present embodiment, two wave guide tubes 5 were used. The discharge chamber 100 was composed of two electron heating space chambers 1 which were provided at downstream side of the dielectric bodies 6 in the respective wave guide tubes, and a plasma generating space chamber 2 which was commonly connected to the respective electron heating space chambers 1 at downstream side. As the shape of the electron heating space chamber 1 is as same as the chamber used in the first embodiment, detailed explanation is omitted here.

On the other hand, the plasma generating space chamber 2 had a different shape from that in the first embodiment, and was formed in a box shape of 500 mm high, 700 mm wide, and 200 mm deep with non-magnetic material such as stainless steel. Two electron heating space chambers 1 are installed respectively at top wall 8a of the plasma generating space chamber 2 with an interval of about 300 mm wide. The outer dimensions of the respective electron heating space chambers 1 is mutually same. Further, plural permanent magnets 4 as for the second static magnetic field generating means are arranged at the top wall 8a of the plasma generating space chamber 2 so as to surround the permanent magnets 3 as for the first static magnetic field generating means with designated intervals in a manner that the direction of magnetic poles of the magnets are alternatively inverted. A plurality of the permanent magnets are also arranged at the peripheral wall 8b of the plasma generating space chamber 2 to form a multipole magnetic field in the plasma generating space chamber 2 as shown by the lines of magnetic force 9 in FIG. 8. In this case, the permanent magnet 4 is made of samarium-cobalt (residual magnetic flux density is about 11,000 G), and is 6 mm thick, 20 mm long in the magnetized direction, and the interval between the adjacent magnets is 30–80 mm mutually.

In accordance with the structures in the present embodiment, high energy electrons are generated in respective electron heating space chambers 1, and the high energy electrons diffuse toward the plasma generating space chamber 2. The high energy electrons collide with the gas supplied by the gas supplying means 7 during moving in the multipole magnetic field and are ionized. Therefore, even if the plasma generating space chamber 2 has a large cross sectional area, uniform plasma having a high density and a low temperature can be generated stably. Accordingly, as plasma can be generated stably in the plasma generating space chamber 2 having a large cross sectional area by the present embodiment, the treating chamber 23 can be made wide and broad substrate 20 can be treated certainly.

Embodiment 6

Figure 10:
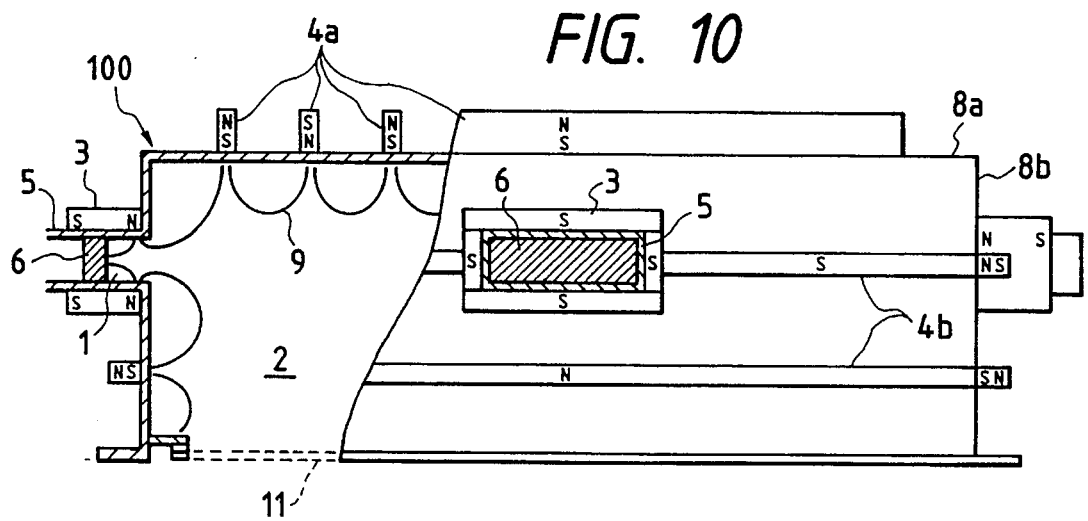
FIG. 10 is a schematic elevational view, partly in section, of the microwave plasma generator in the sixth embodiment of the present invention.
Figure 11:
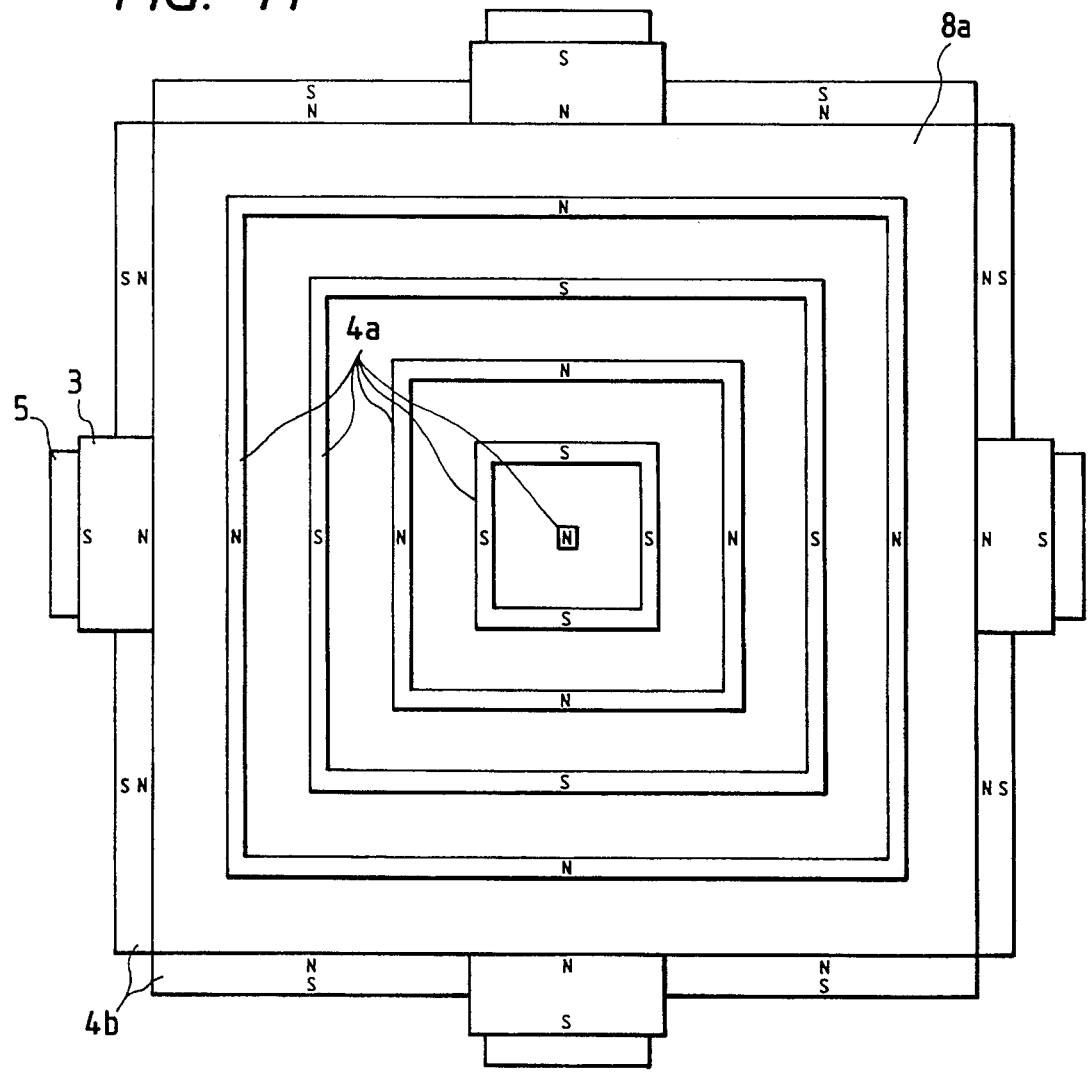
FIG. 11 is a plan view of the microwave plasma generator shown in FIG. 10.

FIGS. 10 and 11 indicate the sixth embodiment of the present invention.

In the present embodiment, uniform plasma is generated using plural electron heating space chambers 1 as same as the previous fifth embodiment. The different point of the present embodiment from the fifth embodiment is in the structure wherein the plasma generating space chamber 1 is formed in a cubic body having square side walls, and the respective wave guide tubes 5 having the electron heating space chamber 1 is connected to the center portion of the respective square side walls composing the outer periphery of the cubic body. The plasma generating space chamber 2 is, for instance, 700 mm wide and 250 mm high, and is made of non-magnetic material as same as the other embodiments.

The number of the wave guide tubes 5 having the electron heating space chamber 1 is four corresponding to each of the four side walls of the plasma generating space chamber 2, and all of the wave guide tubes 5 are connected to the side walls respectively so that all axial line of the wave guide tubes 5 intersect with the central axial line of the plasma generating space chamber 2. The electron heating space chamber 1 of the wave guide tube 5 and the permanent magnets 3 are same as that of the first embodiment.

In accordance with the present embodiment, although particles are released from the treating chamber 23 when ion beams are irradiated to the substrate 20 in the treating chamber 23, adhesion of the released particles to the dielectric body 6 in the wave guide tube 5 can be prevented as possible because each of the wave guide tubes 5 and the electron heating space chambers 1 is connected perpendicularly to the plasma generating space chamber 2. As the result, even if the substrate is made of electric conductive material, ion beam etching process can be performed for a long time. In the above discussion., an example wherein the plasma generating space chamber 2 was formed in a cubic body was explained. However, a spherical body can be used naturally with the same advantages.

Embodiment 7

Figure 12:
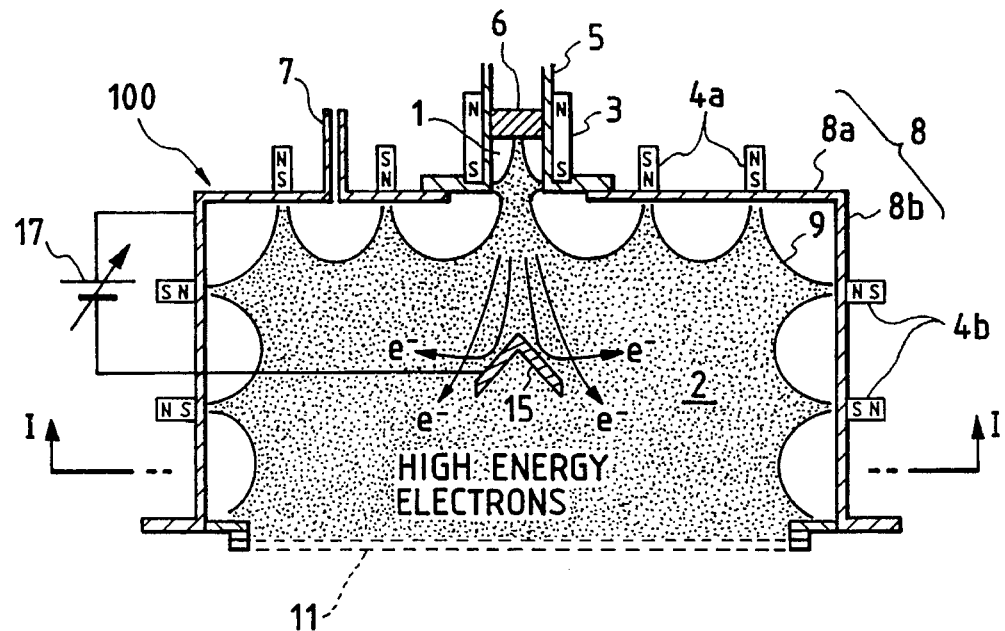
FIG. 12 is a schematic cross sectional view of the microwave plasma generator indicating the seventh embodiment of the present invention.
Figure 13:
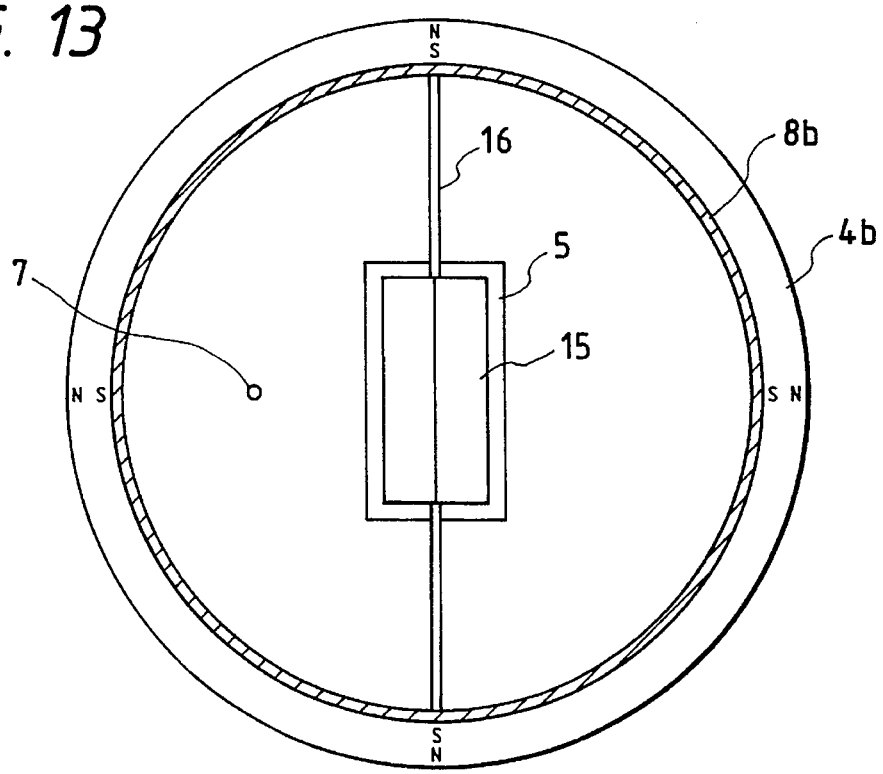
FIG. 13 is a cross sectional view taken along the line I—I in FIG. 12.

FIGS. 12 and 13 indicate the seventh embodiment of the present invention.

In the present embodiment, the wave guide tube 5 and the plasma generating space chamber 2 are arranged on a same axial center line. The present embodiment is featured in being provided with baffle 15 for diffusing electrons into the plasma generating space chamber 2. The baffle 15 is made of electric conductive angle member (one side of the angle material is 30 mm wide and long 120 mm long), and is installed at an intermediate portion on the central axis of the electron heating space chamber 1 in the plasma generating space chamber 2 by a supporting member 16 made of insulating material so that the top portion of the angle member is directed toward the electron heating space chamber 1 as shown in FIG. 12. A means for supplying negative bias 17 to the baffle 15 is connected to the baffle 15. Using the means for supplying negative bias 17, negative bias of 0–100 V, preferably 15–60 V, is supplied to the baffle 15 so that the high energy electron can be diffused widely in the plasma generating space chamber 2 by making the high energy electron reflect as shown by the arrow e⁻in FIG. 12 when the high energy electron from the electron heating space chamber 1 collides with the baffle 15 in the plasma generating space chamber 2.

In accordance with the present embodiment, the high energy electron can be diffused widely in the plasma generating space chamber 2 by the effect of the baffle 15. Additionally, adhesion of the conductive particles to the dielectric body 6 in the wave guide tube 5 can be decreased remarkably. The effect of the electron diffusion by the baffle 15 is significantly effective when negative bias is supplied to the conductive baffle 15, but the above effect can be expected somewhat only by making the baffle with insulating material without supplying the negative bias.

Embodiment 8

The eighth embodiment of the present invention is shown in FIG. 14.

In the present embodiment, the present invention is applied to a plasma treating apparatus, wherein air inside the apparatus is pumped out by a pumping system for exhaust gas at first in treating process, subsequently a specified gas is introduced into the apparatus for making the inside in the specified gas atmosphere by a gas introducing system, plasma is generated in the plasma generating space chamber 2 by introducing microwave through the wave guide tube 5, and the substrate 20 is treated with the plasma and accompanied radicals on a supporter 21 without bias (or applied with bias by alternate current or direct current). Generally, the plasma treating apparatus requires more amount of gas flow than the gas flow for an ion source in a same scale.

Therefore, in the present embodiment, a permanent magnet 4a in the permanent magnets 4a, 4b for forming a multipole magnetic field in the plasma generating space chamber 2 is arranged at the top wall 8a as well as the previous embodiments, and the permanent magnet 4b is arranged inside of the plasma generating space chamber 2. In the present case, the permanent magnet is shielded by a thermal insulating member 24 which is composed of a material which does not contaminate the substrate 20 and prevents the permanent magnet 4b from being effected with any thermal influence, and is arranged by a supporting means (not shown in the drawing). Conductance of the exhaust gas pumping from the plasma generating space chamber 2 can be increased by pumping out the exhaust gas from intervals between the permanent magnets 4b through exhaust gas passages in the plasma generating space chamber 2, and consequently, a large amount of gas can be introduced into the apparatus with keeping an adequate high vacuum condition. The permanent magnet described above is smaller in size in comparison with a solenoid coil, and has no self heat generation. Therefore, the permanent magnets 4b can be readily arranged in the plasma generating space chamber 2 by the supporting means. As described above, the exhaust gas passages 8c are formed in the plasma generating space chamber 2. When placing the substrate 20 inside the plasma generating space chamber 2, the position placing the substrate 20 is equal to the position of the beam extracting electrode 11, the intensity of the magnetic field of the permanent magnets 3 as for the first static magnetic field generating means is fundamentally same as that of the first embodiment or the second embodiment, and the projections can be provided in the internal structure of the electron heating space chamber 1 in the present embodiment as well as the third and fourth embodiments.

in the previously described embodiments, a same amount of electrons as the amount of the ion current extracted as the beam must be collected to the beam extracting electrodes 11 or vacuum wall in the plasma generating chamber 2. Therefore, the electrodes 11 or the vacuum wall in the plasma generating space chamber must be made of electric conductive material. Besides, a treating chamber 23 must be provided separately from the plasma generating space chamber 2. On the contrary, the above described necessity is not required in the present embodiment, and the substrate 20 can be treated with plasma as being placed just as it is in the plasma generating space chamber 2 by making all members contacting the plasma such as the wave guide tube 5, vacuum wall in the plasma generating space chamber 2, the permanent magnets and the supporting means and the others covered with insulating material such as quartz for preventing the substrate 20 from being contaminated with metal. Naturally, the above permanent magnets 4a, 4b are arranged so that magnetic polarity of adjacent magnet are mutually inverted.

As described above, in accordance with claims 1–8 of the present invention, the electron heating space chamber is provided in order to make the microwave of strong electric field enter stably into the wave guide tube, permanent magnets are arranged at outer periphery of the electron heating space chamber as for the first static magnetic field generating means, the permanent magnet forms strong magnetic field exceeding the intensity of the electron cyclotron resonance magnetic field at microwave exit in the dielectric body, and cusped magnetic field is formed in a manner that the magnetic field is decreased in the boundary region from the microwave exit in the dielectric body to the vicinity of the boundary between the electron heating space chamber and the plasma generating space chamber, and the direction of the magnetic field is inverted in a region from the vicinity of the boundary between the electron heating space chamber and the plasma generating space chamber toward the plasma generating space chamber. Therefore, size of the permanent magnet can be decreased and production cost can be lowered. Additionally, a plurality of permanent magnets as for the second static magnetic field generating means are arranged at outer periphery of the plasma generating space chamber so that magnetic polarity of adjacent magnets are mutually inverted. Therefore, high density plasma uniform in a wide range can be formed stably in the plasma generating space chamber, and the plasma can be used stably for manufacturing magnetic material and others. As the result, an advantage that products having preferable quality can be treated stably with plasma in a wide surface area can be realized.

What is claimed is:

1. A microwave plasma generator comprising:

a wave guide tube for transmitting microwave, an electron heating space chamber formed at a location in downstream side from a dielectric body in the wave guide tube, a plasma generating space chamber connected to the electron heating space chamber, first static magnetic field generating means, which comprises permanent magnets surrounding outer periphery of the electron heating space chamber, forming a strong magnetic field of which intensity exceeds an intensity of electron cyclotron resonance magnetic field at a microwave exit of the dielectric body, along the microwave transmitting direction in the electron heating space chamber, and concurrently forming a cusped magnetic field, wherein a magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, and a second static magnetic field generating means comprising permanent magnets which are arranged at around the plasma generating space chamber with alternately reverse polarity.

2. A microwave plasma generator comprising:

a wave guide tube for transmitting microwave having a dielectric body inside, a discharge chamber connected to downstream side of the wave guide tube for generating plasma by receiving microwave from the wave guide tube in a specified gas atmosphere, comprising an electron heating space chamber formed at a location in downstream side from the dielectric body in the wave guide tube along the axial direction for heating electrons, plasma generating space chamber formed at the downstream side of the electron heating space chamber for generating plasma, a first static magnetic field generating means, which comprises permanent magnets surrounding outer periphery of the electron heating space chamber, forming a strong magnetic field of which intensity exceeds an intensity of electron cyclotron resonance magnetic field at a microwave exit of the dielectric body along the microwave transmitting direction in the electron heating space chamber, and concurrently forming a cusped magnetic field, wherein a magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, and a second static magnetic field generating means comprising plural permanent magnets which are arranged at around the plasma generating space chamber with alternately reverse polarity, and a treatment chamber for treating an object irradiating ions in the generated plasma.

3. A microwave plasma generator comprising:

a wave guide for transmitting microwave having a dielectric body inside, a discharge chamber connected to downstream side of the wave guide tube for generating plasma by receiving microwave from the grave guide tube in a specified gas atmosphere, comprising an electron heating space chamber formed at a location in downstream side from the dielectric body in the wave guide tube along the axial direction for heating electrons, a plasma generating space chamber formed at the downstream side of the electron heating space chamber for generating plasma, a first magnetic field generating means, which comprises permanent magnets surrounding outer periphery of the electron heating space chamber, forming a strong magnetic field of which intensity exceeds an intensity of electron cyclotron resonance magnetic field at a microwave exit of the dielectric body along the microwave transmitting direction in the electron heating space chamber, and concurrently forming a cusped magnetic field, wherein a magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, a second static magnetic field generating means comprising permanent magnets which are arranged at around the plasma generating space chamber with alternately reverse polarity, and a baffle for diffusing electrons provided in the plasma generating space chamber on the central axis of the electron heating space chamber, and a treatment chamber for treating an object by irradiating ions in the generated plasma.

4. A microwave plasma generator comprising:

a wave guide tube for transmitting microwave having a dielectric body inside, a discharge chamber connected to downstream side of the wave guide tube for generating plasma by receiving microwave from the wave guide tube in a specified gas atmosphere, comprising an electron heating space chamber formed at a location in downstream side from the dielectric body in the wave guide tube along the axial direction for heating electrons, a plasma generating space chamber formed at the downstream side of the electron heating space chamber for generating plasma, a first static magnetic field generating means, which comprises permanent magnets surrounding outer periphery of the electron heating space chamber, and electric magnets surrounding outer periphery of the permanent magnets, forming a strong magnetic field of which intensity exceeds an intensity of electron cyclotron resonance magnetic field at a microwave exit of the dielectric body along the microwave transmitting direction in the electron heating space chamber, and concurrently forming a cusped magnetic field, wherein a magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, and a second static magnetic field generating means comprising permanent magnets which are arranged at around the plasma generating space chamber with alternately reverse polarity, and a treatment chamber for treating an object by irradiating ions in the generated plasma.

5. A microwave plasma generator comprising:

a plurality of wave guide tubes for transmitting microwave having a dielectric body inside, a discharge chamber connected to downstream side of the plural wave guide tubes for generating plasma by receiving microwave from the wave guide tubes in a specified gas atmosphere, comprising electron heating space chambers formed at a location in downstream side from the dielectric body in the respective wave guide tubes along the axial direction respectively for heating electrons, a plasma generating space chamber formed commonly at the downstream side of the electron heating space chambers for generating plasma, first static magnetic field generating means, which comprise permanent magnets surrounding outer periphery of the plural electron heating space chambers, forming a strong magnetic field of which intensity exceeds an intensity of electron cyclotron resonance magnetic field at a microwave exit of the dielectric body along the microwave transmitting direction in the electron heating space chamber, and concurrently forming a cusped magnetic field, wherein a magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, and a second static magnetic field generating means comprising plural permanent magnets which are arranged at around the plasma generating space chamber with alternately reverse polarity, and a treatment chamber for treating an object by irradiating ions in the generated plasma.

6. A microwave plasma generator comprising:

a plurality of wave guide tubes for transmitting microwave having a dielectric body inside, a discharge chamber connected to downstream side of the plural wave guide tubes for generating plasma by receiving microwave from the wave guide tube in a specified gas atmosphere, comprising electron heating space chambers formed at a location in downstream side from the dielectric body in the respective wave guide tubes along the axial direction respectively for heating electrons, plasma generating space chamber provided with the plural electron heating space chambers at periphery being arranged so that the central axis direction intersects the axis directions of the plural electron heating space chamber for generating plasma, first static magnetic field generating means, which comprise permanent magnets surrounding outer periphery of the plural electron heating space chambers, forming a strong magnetic field of which intensity exceeds an intensity of electron cyclotron resonance magnetic field at a microwave exit of the dielectric body along the microwave transmitting direction in the electron heating space chamber, and concurrently forming a cusped magnetic field, wherein magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, and a second static magnetic field generating means comprising plural permanent magnets which are arranged at around the plasma generating space chamber with alternately reverse polarity, and a treatment chamber for treating an object by irradiating ions in the generated plasma.

7. A microwave plasma generator comprising:

a wave guide tube for transmitting microwave having a dielectric body inside, an electron heating space chamber formed at a location in downstream side from the dielectric body in the wave guide tube along the axial direction for heating electrons, a plasma generating space chamber formed at the downstream side of the electron heating space chamber having exhaust gas passages for generating plasma, first static magnetic field generating means, which comprises permanent magnets surrounding outer periphery of the electron heating space chamber, forming a strong magnetic field of which intensity exceeds an intensity of electron cyclotron resonance magnetic field at a microwave exit of the dielectric body along the microwave transmitting direction in the electron heating space chamber, and concurrently forming a cusped magnetic field, wherein a magnetic field with steep gradient in intensity is generated at a portion between the microwave exit of the dielectric body and the boundary between the electron heating space chamber and the plasma generating space chamber, and the direction of the magnetic field is inverted opposite to the direction of the strong magnetic field in the electron heating space chamber in a region from the boundary of the electron heating space chamber with the plasma generating space chamber to interior of the plasma generating space chamber, and a second static magnetic field generating means comprising plural permanent magnets which are arranged at around the plasma generating space chamber with alternately reverse polarity, wherein the permanent magnets arranged inside the plasma generating space chamber are shielded with insulating material.

8. A microwave plasma generator comprising:
a wave guide tube for transmitting microwave having dielectric body inside,
an electron heating space chamber formed at a location in downstream side from the dielectric body in the wave guide tube for heating electrons,
a plasma generating space chamber formed at the downstream side of the electron heating space chamber having exhaust gas passages for generating plasma,
a first static magnetic field generating means, which comprises permanent magnets surrounding outer periphery of the electron heating space chamber, and
electric magnets surrounding outer periphery of the permanent magnets,
forming a strong magnetic field of which intensity exceeds an intensity of electron cyclotron resonance magnetic field at a microwave exit of the dielectric body by operation of both the permanent magnets and the electric magnets, along the microwave transmitting direction in the electron heating space chamber, and
concurrently forming a cusped magnetic field, wherein
magnetic field with steep gradient in intensity is generated at a portion between the microwave exit of the dielectric body and the boundary between the electron heating space chamber and the electron heating space chamber, and
the direction of the magnetic field is inverted opposite to the direction of the strong magnetic field in the electron hearing space chamber in a region from the boundary of the electron heating space chamber with the plasma generating space chamber to interior of the plasma generating space chamber, and
a second static magnetic field generating means comprising plural permanent magnets which are arranged at around the plasma generating space chamber with alternately reverse polarity, wherein
the permanent magnets arranged inside the plasma generating space chamber are shielded with insulating material.

9. A microwave plasma generator as claimed in claim 1, wherein said wave guide tube has a cross section in rectangular shape.

10. A microwave plasma generator as claimed in claim 1, wherein an axial length of said electron heating space chamber is shorter than the wave length of the microwave supplied to the wave guide tube.

11. A microwave plasma generator as claimed in claim 1, wherein said electron heating space chamber is provided with a projection projecting toward the electron heating space chamber along the transmitting direction of the microwave and being arranged at a location, wherein electrons do not move toward the plasma generating space chamber.

12. A microwave plasma generator as claimed in claim 11, wherein said projection is composed of a part of microwave exit of the dielectric body in the electron heating space chamber along the transmitting direction the microwave and projecting toward the electron heating space chamber.

13. A microwave plasma generator as claimed in claim 11, wherein said projection is formed by expanding a part of inner wall of the wave guide tube toward a location wherein electrons do not move toward the plasma generating space chamber.

14. A microwave plasma generator as claimed in claim 2, wherein said wave guide tube has a cross section in rectangular shape.

15. A microwave plasma generator as claimed in claim 3, wherein said wave guide tube has a cross section in rectangular shape.

16. A microwave plasma generator as claimed in claim 4, wherein said wave guide tube has a cross section in rectangular shape.

17. A microwave plasma generator as claimed in claim 5, wherein said wave guide tube has a cross section in rectangular shape.

18. A microwave plasma generator as claimed in claim 6, wherein said wave guide tube has a cross section in rectangular shape.

19. A microwave plasma generator as claimed in claim 7, wherein said wave guide tube has a cross section in rectangular shape.

20. A microwave plasma generator as claimed in claim 8, wherein said wave guide tube has a cross section in rectangular shape.

21. A microwave plasma generator as claimed in claim 2, wherein an axial length of said electron heating space chamber is shorter than the wave length of the microwave supplied to the wave guide tube.

22. A microwave plasma generator as claimed in claim 3, wherein an axial length of said electron heating space chamber is shorter than the wave length of the microwave supplied to the wave guide tube.

23. A microwave plasma generator as claimed in claim 4, wherein an axial length of said electron heating space chamber is shorter than the wave length of the microwave supplied to the wave guide tube.

24. A microwave plasma generator as claimed in claim 5, wherein an axial length of said electron heating space chamber is shorter than the wave length of the microwave supplied to the wave guide tube.

25. A microwave plasma generator as claimed in claim 6, wherein an axial length of said electron heating space chamber is shorter than the wave length of the microwave supplied to the wave guide tube.

26. A microwave plasma generator as claimed in claim 7, wherein an axial length of said electron heating space chamber is shorter than the wave length of the microwave supplied to the wave guide tube.

27. A microwave plasma generator as claimed in claim 8, wherein an axial length of said electron heating space chamber is shorter than the wave length of the microwave supplied to the wave guide tube.

28. A microwave plasma generator as claimed in claim 2, wherein said electron heating space chamber is provided with a projection projecting toward the electron heating space chamber along the transmitting direction of the microwave and being arranged at a location, wherein electrons do not move toward the plasma generating space chamber.

29. A microwave plasma generator as claimed in claim 3, wherein said electron heating space chamber is provided with a projection projecting toward the electron heating space chamber along the transmitting direction of the microwave and being arranged at a location, wherein electrons do not move toward the plasma generating space chamber.

30. A microwave plasma generator as claimed in claim 4, wherein said electron heating space chamber is provided with a projection projecting toward the electron heating space chamber along the transmitting direction of the microwave and being arranged at a location, wherein electrons do not move toward the plasma generating space chamber.

31. A microwave plasma generator as claimed in claim 5, wherein said electron heating space chamber is provided with a projection projecting toward the electron heating space chamber along the transmitting direction of the microwave and being arranged at a location, wherein electrons do not move toward the plasma generating space chamber.

32. A microwave plasma generator as claimed in claim 6, wherein said electron heating space chamber is provided with a projection projecting toward the electron heating space chamber along the transmitting direction of the microwave and being arranged at a location, wherein electrons do not move toward the plasma generating space chamber.

33. A microwave plasma generator as claimed in claim 7, wherein said electron heating space chamber is provided with a projection projecting toward the electron heating space chamber along the transmitting direction of the microwave and being arranged at a location, wherein electrons do not move toward the plasma generating space chamber.

34. A microwave plasma generator as claimed in claim 8, wherein said electron heating space chamber is provided with a projection projecting toward the electron heating space chamber along the transmitting direction of the microwave and being arranged at a location, wherein electrons do not move toward the plasma generating space chamber.

* * * * *